US012364110B2

(12) United States Patent
Kwak (10) Patent No.: US 12,364,110 B2
(45) Date of Patent: Jul. 15, 2025

(54) ORGANIC LIGHT EMITTING DISPLAY PANEL AND METHOD FOR MANUFACTURING THE SAME

(71) Applicant: LG Display Co., Ltd., Seoul (KR)

(72) Inventor: Jin Ah Kwak, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 457 days.

(21) Appl. No.: 17/970,208

(22) Filed: Oct. 20, 2022

(65) Prior Publication Data

US 2023/0217719 A1     Jul. 6, 2023

(30) Foreign Application Priority Data

Dec. 30, 2021   (KR) .................. 10-2021-0192810

(51) Int. Cl.
| | | |
|---|---|---|
| *H10K 59/122* | (2023.01) | |
| *H10K 71/00* | (2023.01) | |
| *H10K 71/13* | (2023.01) | |
| *H10K 59/12* | (2023.01) | |
| *H10K 102/00* | (2023.01) | |

(52) U.S. Cl.
CPC .......... *H10K 59/122* (2023.02); *H10K 71/00* (2023.02); *H10K 71/135* (2023.02); *H10K 59/1201* (2023.02); *H10K 2102/00* (2023.02)

(58) Field of Classification Search
None
See application file for complete search history.

(56) References Cited

U.S. PATENT DOCUMENTS

| | | | | |
|---|---|---|---|---|
| 2020/0185468 A1* | 6/2020 | Zhang | ............... | H10K 59/8731 |
| 2020/0235178 A1* | 7/2020 | Shin | ....................... | H10K 50/15 |
| 2020/0343319 A1* | 10/2020 | Matsueda | ........... | H10K 59/131 |
| 2020/0373364 A1* | 11/2020 | Yoon | ................... | H10K 59/122 |
| 2022/0045144 A1* | 2/2022 | Lee | ...................... | H10K 71/621 |
| 2024/0215335 A1* | 6/2024 | Huang | ................ | H10K 59/124 |

\* cited by examiner

*Primary Examiner* — Michelle Mandala
(74) *Attorney, Agent, or Firm* — Birch, Stewart, Kolasch & Birch, LLP (57) ABSTRACT

An organic light emitting display panel including a substrate including a plurality of subpixel regions; a first electrode disposed on the substrate in each subpixel region; a first bank layer disposed in a boundary portion of each subpixel region and covering an edge of the first electrode, the first bank layer including micropatterns at an upper surface thereof, a first printed organic material layer disposed on the first electrode and a side surface of the first bank layer; a second deposited organic material layer disposed on the first organic material layer and the first bank layer; a second bank layer disposed at the upper surface of the first bank layer; a third printed organic material layer disposed on the side surface of the first bank layer and the second organic material layer; a fourth deposited organic material layer disposed on the third organic material layer and the second bank layer; and a second electrode disposed on the fourth organic material layer.

20 Claims, 10 Drawing Sheets

ORGANIC LIGHT EMITTING DISPLAY PANEL AND METHOD FOR MANUFACTURING THE SAME

CROSS-REFERENCE TO RELATED APPLICATION

This application claims priority to Korean Patent Application No. 10-2021-0192810 filed in the Republic of Korea on Dec. 30, 2021, the entire contents of which are hereby incorporated by reference into the present application.

BACKGROUND OF THE INVENTION

Field of the Invention

The present invention relates to an organic light emitting display panel and a method for manufacturing the same to enhance display quality through a combination of an inkjet printing process and a deposition process.

Discussion of the Related Art

Display devices include an organic light emitting display device using an organic light emitting diode, which is a self-luminous element configured to emit light from an emission material layer thereof through re-combination of an electron and a hole. The device thus includes a rapid response time, high brightness, low driving voltage, and ultra-thinness, and is also implemented to have various shapes.

SUMMARY OF THE INVENTION

Accordingly, the present disclosure is directed to an organic light emitting display panel and a method for manufacturing the same that substantially obviate one or more problems due to limitations and disadvantages of the related art.

An object of the present invention is to provide an organic light emitting display panel and a method for manufacturing the same, which are capable of realizing a light emitting element having a multi-stack structure through combination of an inkjet printing process and a deposition process.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light emitting display panel includes a substrate including a plurality of subpixel regions, a first electrode disposed on the substrate in each of the subpixel regions, a first bank layer disposed in a boundary portion of each of the subpixel regions while covering an edge of the first electrode, the first bank layer being formed with micropatterns at an upper surface thereof, a first organic material layer disposed on the first electrode and a side surface of the first bank layer, a second organic material layer disposed on the first organic material layer and the first bank layer, a second bank layer disposed at the upper surface of the first bank layer, a third organic material layer disposed on the side surface of the first bank layer and the second organic material layer, a fourth organic material layer disposed on the third organic material layer and the second bank layer, and a second electrode disposed on the fourth material layer.

In another aspect of the present invention, a method for manufacturing an organic light emitting display panel includes forming a first electrode on a substrate including a plurality of subpixel regions in each of the subpixel regions, forming a first bank layer formed with micropatterns at an upper surface thereof in a boundary portion of each of the subpixel regions such that the first bank layer covers an edge of the first electrode, forming a first organic material layer on the first electrode through an inkjet printing process, forming a second organic material layer on the substrate formed with the first organic material layer through a deposition process, forming a second bank layer at the upper surface of the first bank layer, forming a third organic material layer on the second organic material layer on the substrate formed with the second bank layer through an inkjet printing process, forming a fourth organic material layer on the third organic material layer and the second bank layer through a deposition process, and forming a second electrode disposed on the fourth organic material layer.

The first organic material layer cancan include a hole injection layer, a first hole transport layer, and a first emission material layer, and the second organic material layer cancan include a first electron transfer layer and a charge generation layer. The charge generation layer cancan include a first metal oxide layer of an amorphous compound of zinc oxide and silicon oxide and a second metal oxide layer of molybdenum oxide ohmic-contact each other. Also, the third organic material layer cancan include a second hole transport layer and a second emission material layer. In addition, fourth organic material layer cancan include a second electron transfer layer and an electron injection layer.

Also, the organic light emitting display panel and the manufacturing method of the same according to the exemplary embodiments of the present invention have the following effects. A light emitting element having a multi-stack structure cancan be formed through combination of an inkjet printing process and a deposition process. Accordingly, it is possible to not only enhance luminous brightness, but also enhance display quality of the organic light emitting display panel. In addition, because the light emitting element is configured through combination of an inkjet printing process and a deposition process, materials can be selected for each organic emission material layer.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Hereinafter, an organic light emitting display panel according to an exemplary embodiment of the present invention, which has the above-described features, will be described in detail with reference to the accompanying drawings. Throughout the specification, the same reference numerals designate substantially the same constituent elements.

Figure 1:
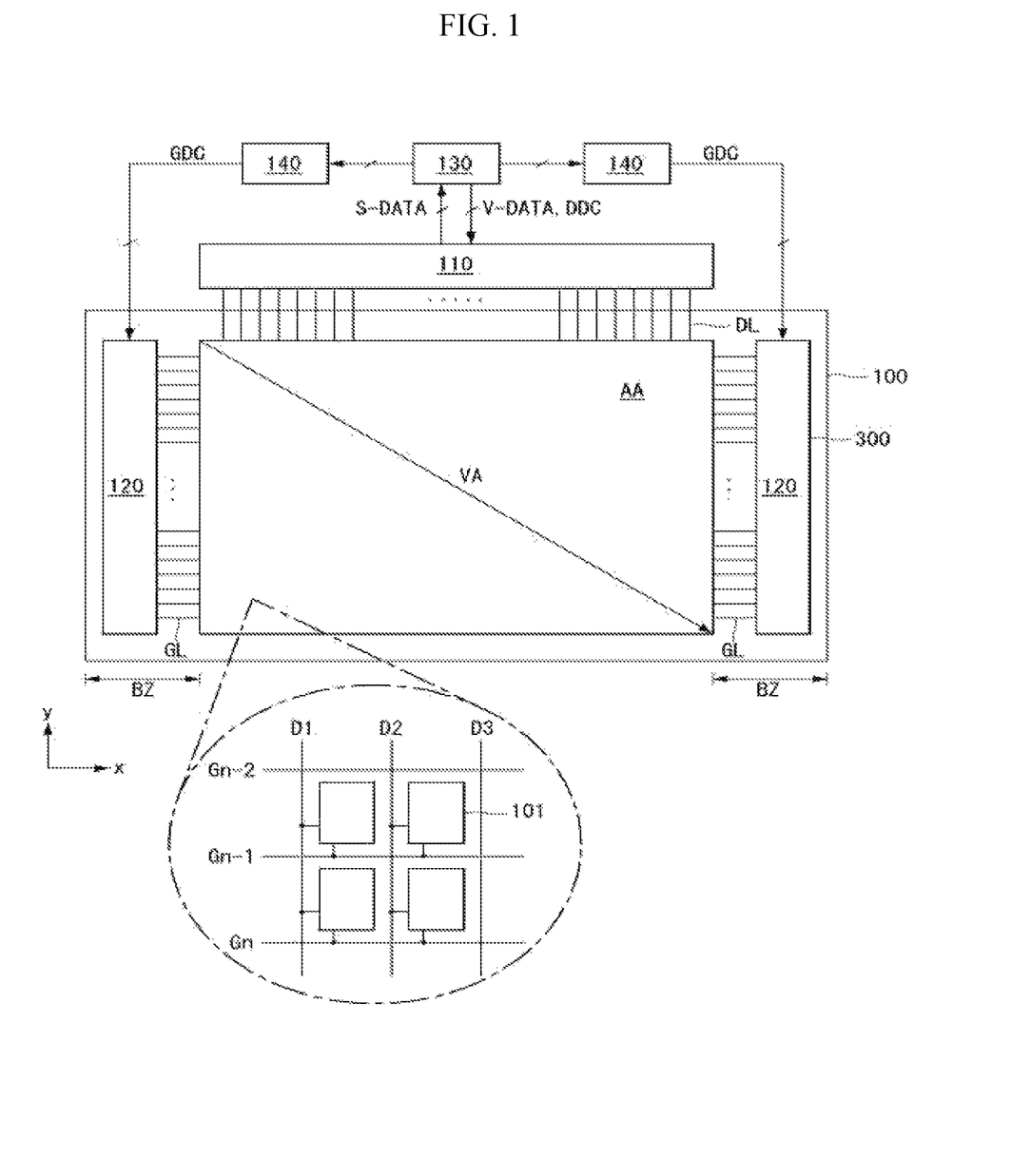
FIG. 1 is a block diagram showing an organic light emitting display device according to an exemplary embodiment of the present invention.

FIG. 1 is a block diagram showing an organic light emitting display device according to an exemplary embodiment of the present invention. As shown, the organic light emitting display device includes an organic light emitting display panel 100 and a display panel driving circuit.

The display panel 100 includes an active area AA configured to display data of an input image. As shown, an array of the active area AA includes a plurality of data lines DL, a plurality of gate lines GL intersecting the data lines DL, and pixels disposed in the form of a matrix. The pixels can be disposed in various forms including pixels emitting light of the same color, a stripe form, a diamond form, and the like, in addition to the matrix form.

Each of the pixels can be divided into a red subpixel, a green subpixel, and a blue subpixel, for color rendering. Each pixel can further include a white subpixel. Also, each subpixel 101 can include a pixel circuit having a light emitting element, a plurality of thin film transistors (TFTs) and a capacitor for an electroluminescent display device. As shown in FIG. 1, the pixel circuit is connected to corresponding data lines DL and the gate lines GL. "D1 to D3" indicated within the circle in FIG. 1 designate data lines, and "Gn−2 to Gn" indicated within the circle designate gate lines.

In addition, touch sensors are disposed on the display panel 100. In particular, touch input can be sensed using separate touch sensors or through pixels. The touch sensors can also be disposed on a screen of the display panel 100 in an on-cell type or an add-on type or can be implemented as in-cell type touch sensors built in a pixel array.

Further, the display panel driving circuit includes a data driving circuit 110 and a gate driving circuit 120. The display panel driving circuit writes data of an input image on the pixels of the display panel under control of a timing controller (TCON) 130. In addition, the data driving circuit 110 converts pixel data of an input image received from the timing controller 130 in every frame, that is, digital data V-DATA, into a gamma compensation voltage, thereby outputting a data signal. The data driving circuit 110 also supplies a voltage of the data signal (hereinafter referred to as a "data voltage") to the data lines DL. Further, the data driving circuit 110 outputs the data voltage using a digital-to-analog converter (hereinafter referred to as a "DAC") configured to convert digital data V-DATA into a gamma compensation voltage.

In addition, the gate driving circuit 120 can be implemented as a gate-in-panel (GIP) circuit directly formed on a substrate of the display panel 100 together with the pixel array disposed in the active area AA of the display panel 100. The GIP circuit can also be disposed in a bezel area BZ of the display panel 100 outside the active area AA. Further, the GIP circuit can be formed in the bezel area BZ in which an image is not displayed.

Further, the gate driving circuit 120 outputs a gate signal (a scan pulse) under control of the timing controller 130, thereby selecting pixels in which the data voltage is charged, through the gate lines GL. The timing controller 130 also receives pixel data of an input image and a timing signal synchronized therewith from a host system. The timing controller 130 generates a data timing control signal DDC for control of an operation timing of the data driving circuit 110 and a gate timing control signal GDC for control of an operation timing of the gate driving circuit 120 based on the timing signal received from the host system.

Figure 2:
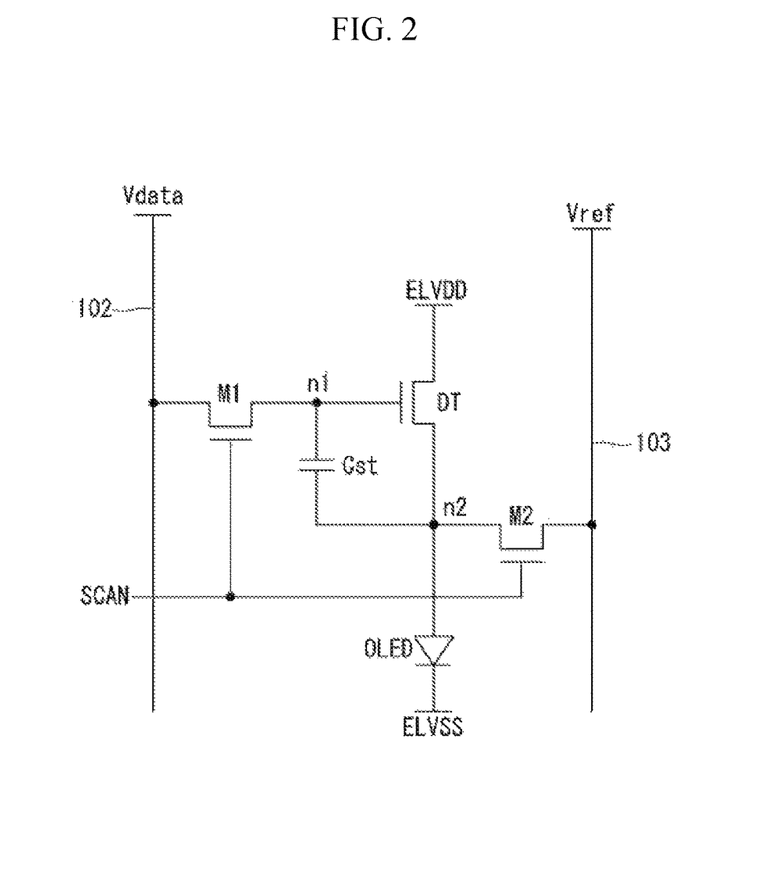
FIG. 2 is a circuit diagram of a circuit configuration of one subpixel of the organic light emitting display panel according to an exemplary embodiment of the present invention.

Next, FIG. 2 is a circuit diagram of one subpixel of the organic light emitting display panel 100 according to an exemplary embodiment of the present invention. As shown in FIG. 2, the subpixel includes a light emitting element OLED, a driving element DT connected to the light emitting element OLED, a plurality of switch elements M1 and M2, and a capacitor Cst.

The light emitting element OLED emits light by current generated in accordance with a gate-source voltage Vgs of the driving element DT varying in accordance with a data voltage Vdata. The light emitting element OLED includes an organic compound layer formed between an anode and a cathode. Further, the organic compound layer can include a hole injection layer HIL, a hole transport layer HTL, an emission material layer EML, an electron transfer layer ETL and an electron injection layer EIL, without being limited thereto. Also, the anode of the light emitting element OLED is connected to the driving element DT via a second node n2, and the cathode of the light emitting element OLED is connected to an ELVSS electrode to which a low-level supply voltage ELVSS is applied.

In addition, the first switch element M1 is turned on in accordance with a gate-on voltage of a scan signal SCAN, thereby connecting a data line 102 to a first node n1. Thus, the first switch element M1 supplies the data voltage Vdata to the first node n1. Also, the second switch element M2 is turned on in accordance with the scan signal SCAN, thereby supplying a reference voltage Vref to the second node n2.

Further, the driving element DT is turned on in accordance with a voltage of the first node n1, and supplies current to the light emitting element OLED in accordance with the gate-source voltage Vgs thereof, thereby driving the light emitting element OLED. As shown, the capacitor Cst is connected between the first node n1 and the second node n2, and maintains the gate-source voltage Vgs of the driving element DT for one frame.

Recently, a method for manufacturing an emission material layer of each subpixel in an organic light emitting display panel through inkjet printing and light emitting elements having a multi-stack structure including at least two emission material layers have been implemented. However, it is difficult to manufacture a light emitting element having a multi-stack structure through inkjet printing.

Accordingly, the exemplary embodiments of the present invention provide an organic light emitting display panel and a method for manufacturing the same, which can realize a light emitting element having a multi-stack structure through a combination of an inkjet printing process and a deposition process.

Figure 3:
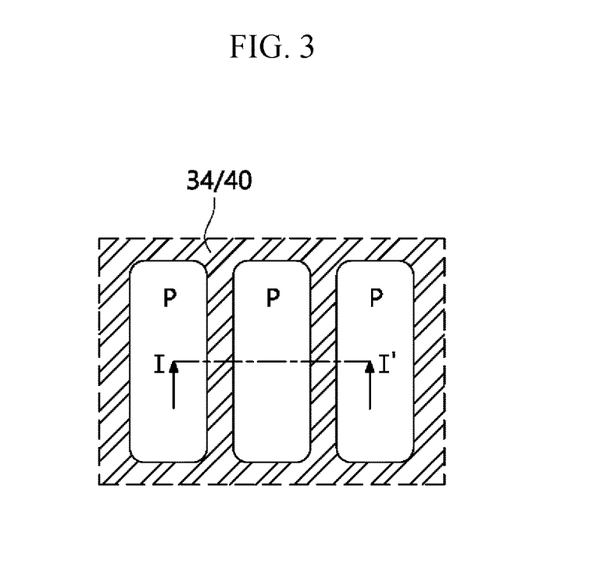
FIG. 3 is a plan view of subpixels of an organic light emitting display panel according to an exemplary embodiment of the present invention.

Next, FIG. 3 is a plan view of subpixels of an organic light emitting display panel according to an exemplary embodiment of the present invention. As shown in FIG. 3, the organic light emitting display panel includes a plurality of subpixel regions P, light emitting elements respectively disposed in the subpixel regions P, and bank layers 34 and 40 in boundary regions of the subpixel regions P in the form of a lattice. Thin film transistors and a light emitting element are also disposed in each subpixel region P.

Figure 4:
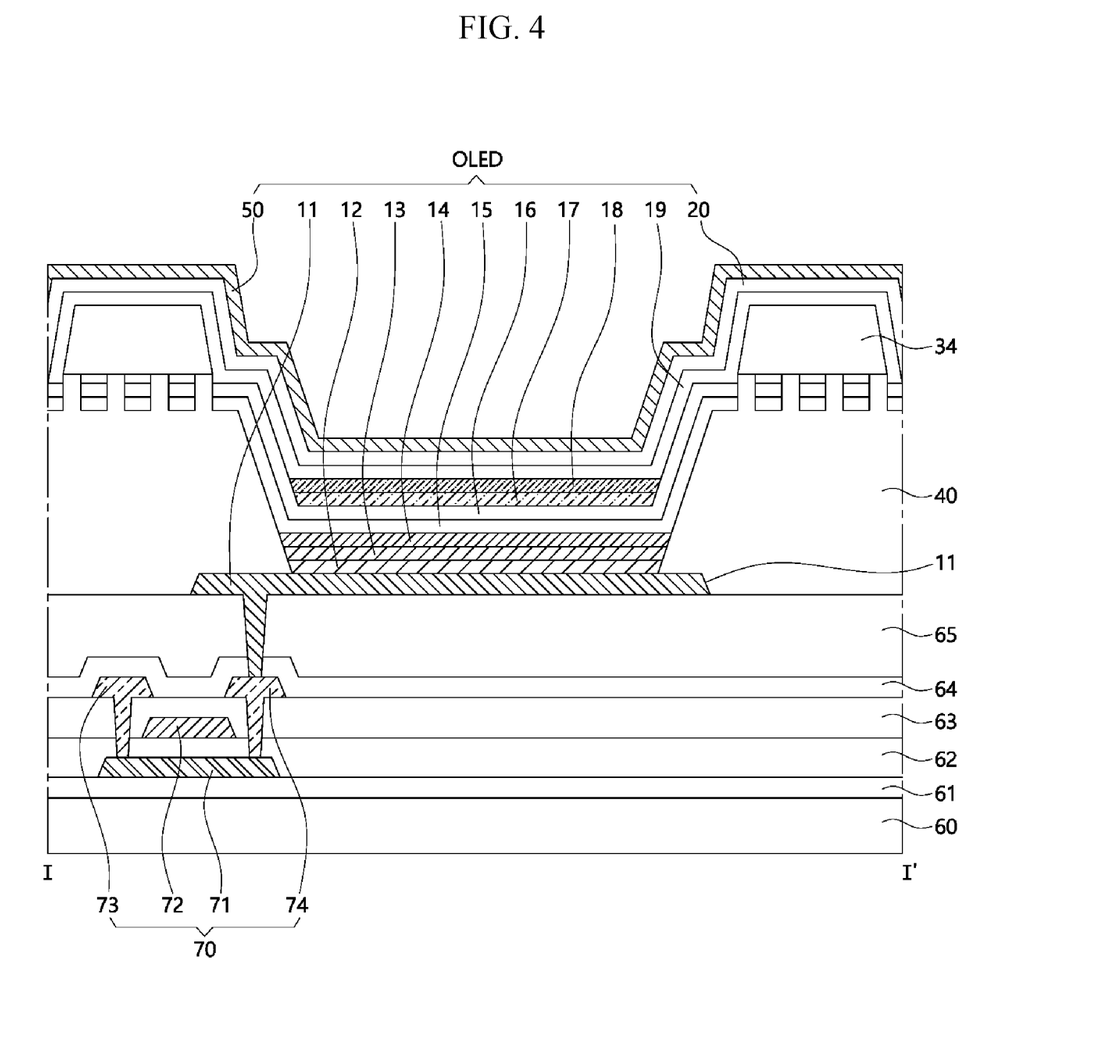
FIG. 4 is a cross-sectional view of one subpixel of an organic light emitting display panel according to a first embodiment of the present invention taken along line I-I' in FIG. 3.

Next, FIG. 4 is a cross-sectional view of one subpixel of an organic light emitting display panel according to a first embodiment of the present invention taken along line I-I' in FIG. 3. As shown in FIG. 4, the organic light emitting display panel includes a substrate 60, a thin film transistor 70, and an organic light emitting element OLED.

The substrate 60 can be made of an insulating material such as glass or a plastic material including polyimide (PI). A buffer layer 61 is also disposed on the substrate 60 and enhances a bonding force between the substrate 60 and layers formed on the buffer layer 61, and blocks leakage of an alkali component from the substrate 60. The buffer layer 61 can include a single layer of silicon nitride ($SiN_x$) or silicon oxide ($SiO_x$), which is an inorganic material, or multiple layers of silicon nitride ($SiN_x$) or silicon oxide ($SiO_x$). In addition, the buffer layer 61 can be omitted based on the kind and material of the substrate 60, and the structure and type of the thin film transistor 70, etc.

Further, the thin film transistor 70 is disposed on the buffer layer 61 and includes an active layer 71, a gate electrode 72, a source electrode 73, and a drain electrode 74. The thin film transistor 70 is the driving element DT shown in FIG. 2, and has a top-gate structure in which the gate electrode 72 is disposed on the active layer 71. However, the embodiments of the present invention are not limited to the above-described conditions.

In addition, the active layer 71 of the thin film transistor 70 is disposed on the buffer layer 61, and a gate insulating layer 62 is disposed on the active layer 71 and the buffer layer 61. The active layer 71 can also be formed of amorphous silicon (a-Si), polycrystalline silicon (poly-Si), an oxide semiconductor, an organic semiconductor, or the like.

The gate insulating layer 62 insulates the active layer 71 and the gate electrode 72 from each other can include a single layer of silicon nitride ($SiN_x$) or silicon oxide ($SiO_x$), which is an inorganic material, or multiple layers of silicon nitride ($SiN_x$) or silicon oxide ($SiO_x$), without being limited thereto.

Further, the holes for bringing the source electrode 73 and the drain electrode 74 into contact with the active layer 71, respectively, are formed at the gate insulating layer 62. Also, the gate electrode 72 is disposed on the gate insulating layer 62, to overlap with the active layer 71 and can include a conductive metal, for example, copper (Cu), aluminum (Al), molybdenum (Mo), or an alloy thereof, without being limited thereto.

An interlayer insulating layer 63 is also disposed on the gate electrode 72 and the gate insulating layer 62. The interlayer insulating layer 63 can include a single layer of silicon nitride ($SiN_x$) or silicon oxide ($SiO_x$), which is an inorganic material, or multiple layers of silicon nitride ($SiN_x$) or silicon oxide ($SiO_x$), without being limited thereto.

Contact holes for bringing the source electrode 73 and the drain electrode 74 into contact with the active layer 71, respectively, are also formed at the interlayer insulating layer 63.

The source electrode 73 and the drain electrode 74 are disposed on the interlayer insulating layer 63. Further, the source electrode 73 and the drain electrode 74 can include a conductive metal, for example, copper (Cu), aluminum (Al), molybdenum (Mo), or an alloy thereof, without being limited thereto. Each of the source electrode 73 and the drain electrode 74 can be electrically connected to the active layer 71 via the contact holes formed at the gate insulating layer 62 and the interlayer insulating layer 63.

A passivation layer 64 can also be disposed on the interlayer insulating layer 63 to cover the thin film transistor 70. The passivation layer 64 can include a single layer of silicon nitride ($SiN_x$) or silicon oxide ($SiO_x$), which is an inorganic material, or multiple layers of silicon nitride ($SiN_x$) or silicon oxide ($SiO_x$), without being limited thereto.

A contact hole for connecting a first electrode 11 of the light emitting element OLED to the thin film transistor 70 is also formed at the passivation layer 64. However, the passivation layer 64 can be omitted in accordance with design of the organic light emitting display panel 100.

A planarization layer 65 is also disposed on the passivation layer 64 and can include an organic material. Further, a contact hole for exposing the drain electrode 74 of the thin film transistor 70 is formed at the planarization layer 65. The light emitting element OLED, which includes a plurality of organic material layers 12 to 20 and a second electrode 50 in addition to the first electrode 11, and bank layers 40 and 34 are disposed on the planarization layer 65.

Also, the light emitting element OLED emits light in a light emission region defined by the bank layers 40 and 34. That is, light is emitted only from a portion of the first electrode 11 of the light emitting element OLED not covered by the bank layers 40 and 34. As shown in FIG. 4, the light emitting element OLED has a multi-stack structure.

In addition, the bank layers 40 and 34 can include a first bank layer 40 and a second bank layer 34. As shown, the upper surface of the first bank layer 40 is formed with various micropatterns and is hydrophobized. Also, the second bank layer 34 is formed at the upper surface of the first bank layer 40 using a hydrophobic ink. In the first embodiment of the present invention, the micropatterns formed at the upper surface of the first bank layer 40 have a pillar shape. The material of the second bank layer 34 will be described in detail in conjunction with a manufacturing method which will be described later.

As shown, the organic material layers 12 to 20 re disposed between the first electrode 11 and the second electrode 50. For example, the plurality of organic material layers 12 to 20 can include a hole injection layer (HIL) 12, a first hole transport layer (HTL) 13, a first emission material layer (EML) 14, a first electron transfer layer (ETL) 15, a charge generation layer (CGL) 16, a second hole transport layer (HIL) 17, a second emission material layer (EML) 18, a second electron transfer layer (ETL) 19, an electron injection layer (EIL) 20, etc.

The hole injection layer (HIL) 12, the first hole transport layer (HTL) 13, the first emission material layer (EML) 14, and the first electron transfer layer (ETL) 15 can be collectively referred to as a "first stack", and the second hole transport layer (HIL) 17, the second emission material layer (EML) 18, the second electron transfer layer (ETL) 19, and the electron injection layer (EIL) 20 can be collectively referred to as a "second stack".

In addition, the hole injection layer (HIL) 12, the first hole transport layer (HTL) 13, and the first emission material layer (EML) 14 are formed using an inkjet printing process in the first embodiment of the present invention and are sequentially formed in this order on the first electrode 11 between adjacent portions of the first bank layer 40. That is, the hole injection layer (HIL) 12, the first hole transport layer (HTL) 13, and the first emission material layer (EML) 14 are not formed at an upper portion of the first bank layer 40 because the upper surface of the first bank layer 40 has hydrophobicity.

In addition, the first electron transfer layer (ETL) 15 and the charge generation layer (CGL) 16 are formed using a deposition process and are sequentially formed in this order to extend on and along upper portions of the first bank layer 40 adjacent to each other and the first emission material layer EML 14. The first electron transfer layer (ETL) 15 and the charge generation layer (CGL) 16 are formed between the micropatterns of the upper surface of the first bank layer 40.

In this instance, the charge generation layer (CGL) 16 is formed such that a first metal oxide layer of an amorphous compound of zinc oxide and silicon oxide and a second metal oxide layer of molybdenum oxide ($MoO_3$) ohmic-contact each other. The second bank layer 34 is also formed at the upper surface of the first bank layer 40 using a hydrophobic ink including Teflon. As shown, the second bank layer 34 can be formed to have a smaller horizontal width than the first bank layer 40 while having a height equal to the depth of the micropatterns of the upper surface of the first bank layer 40 or not greater than about 0.5 micrometers.

In addition, the second hole transport layer (HIL) 17 and the second emission material layer (EML) 18 are disposed on the charge generation layer (CGL) 16 between the adjacent portions of the first bank layer 40. The second hole transport layer (HIL) 17 and the second emission material layer (EML) 18 are formed using an inkjet printing process and are sequentially formed in this order on the charge generation layer (CGL) 16 between the adjacent portions of the first bank layer 40. That is, the second hole transport layer (HIL) 17 and the second emission material layer (EML) 18 are not formed on the second bank layer 34 because the second bank layer 34 has hydrophobicity.

Further, the second hole transport layer (HIL) 17 is formed using an ink having a neutral pH to prevent a phenomenon in which the charge generation layer (CGL) 16, which is an under layer, is dissolved. Accordingly, the second hole transport layer (HIL) 17 does not react with a metal oxide, which is the charge generation layer (CGL) 16. The second electron transfer layer (ETL) 19, the electron injection layer (EIL) 20, and the second electrode 50 are also formed using a deposition process and are sequentially formed in this order to extend on and along the adjacent upper portions of the first bank layer 40, upper portions of the second bank layer 34 adjacent to each other and the second emission material layer (EML) 18.

Hereinafter, a method for manufacturing the organic light emitting display panel according to the first embodiment of the present invention having the multi-stack structure shown in FIG. 4 will be described. In particular, FIGS. 5A to 5G are cross-sectional views taken along line I-I' in FIG. 3 according to the first embodiment of the present invention. The process for manufacturing the thin film transistor 70 is not described and only a process for manufacturing a light emitting element is shown. In addition, a substrate 10 shown in FIGS. 5A to 5G includes all of the substrate 60, the thin film transistor 70 and the planarization layer 65 shown in FIG. 4. The substrate 10 also includes the substrate 60 and the thin film transistor 70 shown in FIG. 4.

Figure 5A:
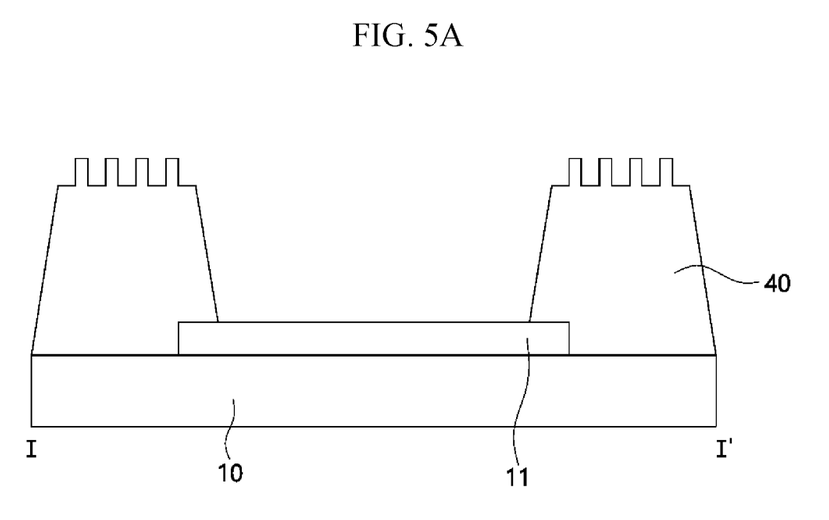
FIGS. 5A to 5G are cross-sectional views taken along line I-I' in FIG. 3 according to the first embodiment of the present invention.

As shown in FIG. 5A, a plurality of first electrodes 11 are formed in a plurality of subpixel regions P, respectively, on the substrate 10 including subpixel regions P. In more detail, the first electrode 11 can be made of a transparent conductive material, for example, indium-tin-oxide (ITO) or indium-zinc-oxide (IZO), or can be made of a metal material. Subsequently, a polyimide type polymer or a carbon compound coated with hydrocarbon or the like is coated on the substrate 10 including the first electrode 11, and is then selectively removed, thereby forming a first bank layer 40 having a lattice form in boundary portions of the subpixel regions P.

In this instance, as shown in FIGS. 4 and 5A, pillar-shaped micropatterns are formed at an upper surface of the first bank layer 40. Accordingly, the upper surface of the first bank layer 40 is hydrophobized by the micropatterns. In more detail, the entire surface of the substrate 10 is coated with a polyimide type polymer or a carbon compound as the material of the first bank layer 40.

Subsequently, the polyimide type polymer or the carbon compound is patterned using an etching process such as a photolithography process, a plasma etching process or an ion milling process. For example, pillar-shaped patterns can be formed at the upper surface of the first bank layer 40 using a halftone mask, simultaneously with formation of the first bank layer 40. A concrete procedure of this process will be described.

First, a polyimide type polymer or a carbon compound and a photoresist layer are sequentially coated on the substrate 10 formed with the first electrode 11. The halftone mask has a transmissive region allowing light to pass therethrough at a portion thereof corresponding to the subpixel region P, a shielding region at portions thereof corresponding to pillar-shaped regions, and a semi-transmissive region at a portion thereof corresponding to a region between the pillar-shaped regions.

In addition, the photoresist layer is subjected to exposure using the above-described halftone mask, and is then subjected to development. As a result, the photoresist layer is completely removed at the portion thereof corresponding to the subpixel region P, remains at the portions thereof corresponding to the pillar-shaped regions, and is removed to a predetermined depth at the portion thereof corresponding to the region between the pillar-shaped regions. Thus, a primary photoresist layer pattern is formed.

When the polyimide type polymer or the carbon compound is primarily etched using the primary photoresist layer pattern as a mask, the polyimide type polymer or the carbon compound is completely removed at a portion thereof corresponding to the subpixel region P. Subsequently, the first photoresist layer pattern is ashed and the photoresist layer remains at a predetermined thickness in the pillar-shaped regions and the photoresist layer is completely removed at the region between the pillar-shaped regions. As a result, a secondary photoresist layer pattern is formed.

Figure 5B:
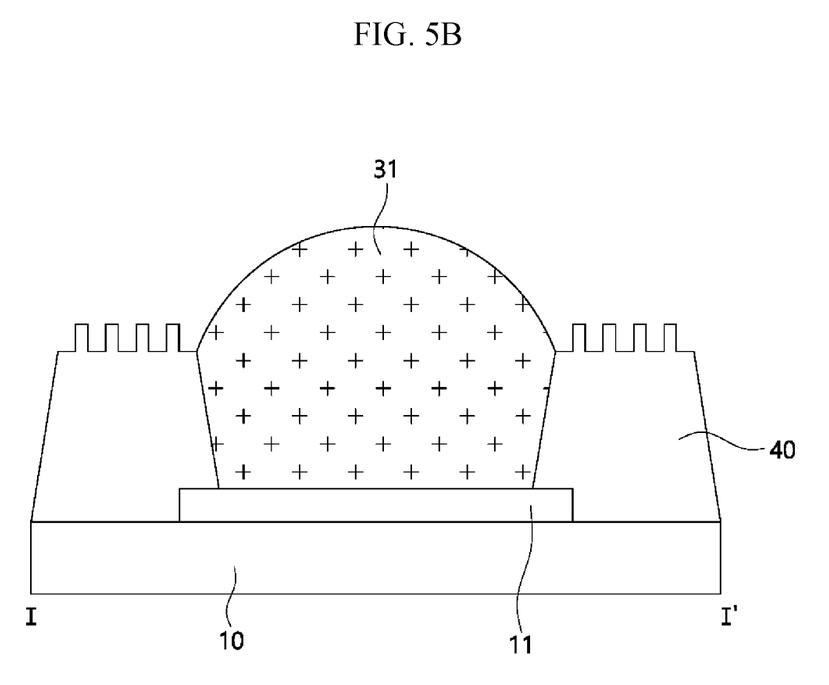

Using the secondary photoresist layer pattern as a mask, the polyimide type polymer or the carbon compound is secondarily etched to a predetermined depth. In accordance with this etching, pillar-shaped micropatterns can be formed at an upper surface of the first bank layer 40. When the upper surface of the first bank layer 40 is hydrophobized, as described above, a first organic material solution 31 is dropped onto the first electrode 11 disposed in each subpixel region P using an inkjet printing process or a soluble process, as shown in FIG. 5B.

In addition, the spreadability of the first organic material solution 31 is determined by the surface tension of the first organic material solution 31, the surface energy of the first electrode 11 disposed in each subpixel region P while contacting the dropped first organic material solution 31, and the surface energy of the first bank layer 40 disposed in the boundary region of each subpixel region P while contacting the dropped first organic material solution 31. That is, when the surface tension of the first organic material solution 31 decreases, the spreadability of the first organic material solution 31 is increased. In addition, when the surface energy of a surface contacting the dropped first organic material solution 31 increases, the spreadability of the first organic material solution 31 is increased.

Further, when the first organic material solution 31 has a low surface tension, the first organic material solution 31 can be non-uniformly dried in a drying process and a thickness uniformity of each layer constituting an organic emission material layer can be degraded. Also, an organic material solution having relatively high surface tension is generally used as the first organic material solution 31. That is, an ink solvent having a high boiling point is used to prevent the first organic material solution 31 from being non-uniformly dried in a drying process.

In addition, the dropped first organic material solution 31 can be provided not only at an upper surface of the first electrode 11, but also at the upper surface of the first bank layer 40. The upper surface of the first bank layer 40 of the organic light emitting display device according to the exemplary embodiment of the present invention is formed with pillar-shaped micropatterns and thus has hydrophobicity.

Accordingly, the spreadability of the first organic material solution 31 is decreased at the upper surface of the first bank layer 40 and it is possible to prevent portions of the first organic material solution 31 dropped onto the subpixel regions P from being mixed with one another. In this instance, the depth of a portion of the first bank layer 40 between the micropatterns formed at the upper surface of the first bank layer 40 is preferably greater than the deposition thickness of a second organic material layer, which will be described later.

Figure 5C:
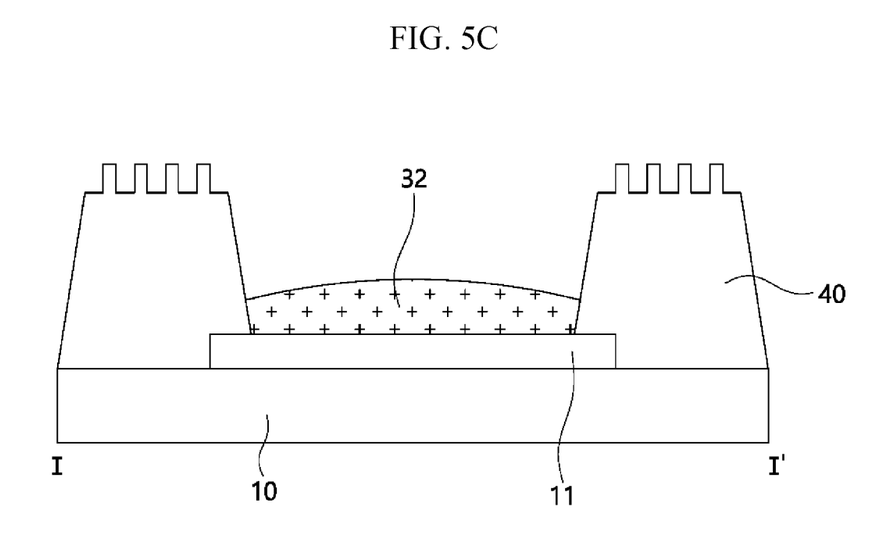

A process of drying the dropped first organic material solution 31 is then performed, thereby evaporating a solvent of the first organic material solution 31. As such, only a solute of the first organic material solution 31 remains, thereby forming a first organic material layer 32 on the first electrode 11, as shown in FIG. 5C.

The first organic material layer 32 can include the hole injection layer (HIL) 12, the first hole transport layer (HTL) 13 and the first emission material layer (EML) 14 shown in FIG. 4. That is, the hole injection layer (HIL) 12, the first hole transport layer (HTL) 13 and the first emission material layer (EML) 14 are formed through repetition of the processes described with reference to FIGS. 5B and 5C.

This will be described in detail. The hole injection layer 12 is formed by dropping and drying a hole injection material solution. The first hole transport layer 13 is then formed by dropping a hole transport material solution onto the hole injection layer and then drying the dropped hole transport material solution. Thereafter, the first emission material layer 14 is formed by dropping a first emission material solution onto the first hole transport layer, and then drying the first emission material solution.

Figure 5D:
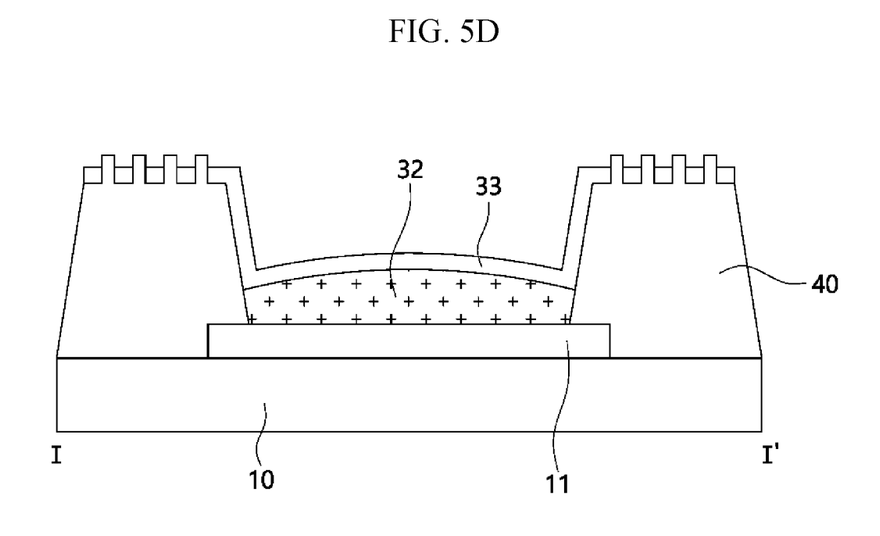

As shown in FIG. 5D, a second organic material layer 33 is formed on the substrate 10 including the first organic material layer 32, using a deposition process. In this instance, formation of the second organic material layer 33 is performed so the second organic material layer 33 is deposited between the micropatterns of the upper surface of the first bank layer 40. Because the depth of the portion of the first bank layer 40 between the micropatterns of the upper surface of the first bank layer 40 is greater than the thickness of the deposited second organic material layer 33, as described with reference to FIG. 5A, the deposited second organic material layer 33 is filled between pillar-shaped patterns of the first bank layer 40, as shown in FIG. 5D.

In this instance, the second organic material layer 33 can include the first electron transfer layer (ETL) 15 and the charge generation layer (CGL) 16 shown in FIG. 4. That is, the first electron transfer layer 15 is formed on the substrate 10 formed with the first organic material layer 32, using a deposition process Thereafter, the charge generation layer 16 is formed on the first electron transfer layer 15, using a deposition process.

In this instance, the charge generation layer 16 is formed of a metal oxide to prevent a third organic material layer, which will be formed in a subsequent process, from being dissolved by the third organic material layer. For example, a first metal oxide layer of an amorphous compound of zinc oxide and silicon oxide ($ZnO$—$SiO_2$; a-ZSO) and a second metal oxide layer of molybdenum oxide ($MoO_3$) are formed to ohmic-contact each other.

Figure 5E:
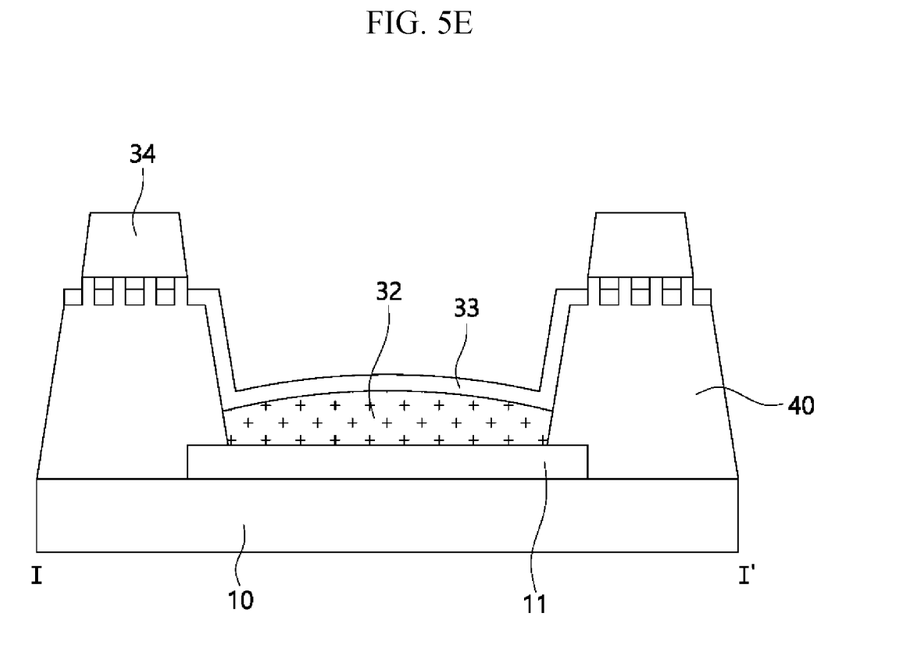

As shown in FIG. 5E, a second bank layer 34 is formed at the upper surface of the first bank layer 40 using a hydrophobic ink including Teflon. In particular, the hydrophobic ink including Teflon can be produced by dissolving a solute of poly[4,5-difluoro-2,2-bis(trifluoromethyl)-1.3-dioxole-co-tetrafluoroethylene] in a solvent of hexafluorobenzene.

The hydrophobic ink including Teflon, which has been produced as described above, is then charged in a charger. The substrate 10 formed with the second organic material layer 33 described with reference to FIG. 5D is then heated to 90 to 150 degrees. Subsequently, the hydrophobic ink including Teflon, which is charged in the charger, is dropped onto the upper surface of the first bank layer 40 on the heated substrate 10, using an inkjet printing process or a soluble process, thereby forming a second bank layer pattern.

Thereafter, thermal treatment is performed for the substrate 10 in a chamber having a nitrogen atmosphere at a temperature of 110 to 150 degrees for 10 minutes or more, thereby completing the second bank layer 34. The second bank layer 34 is formed to have a smaller horizontal width than the first bank layer 40 while having a height equal to the depth of the micropatterns of the upper surface of the first bank layer 40 or not greater than about 0.5 micrometers.

Figure 5F:
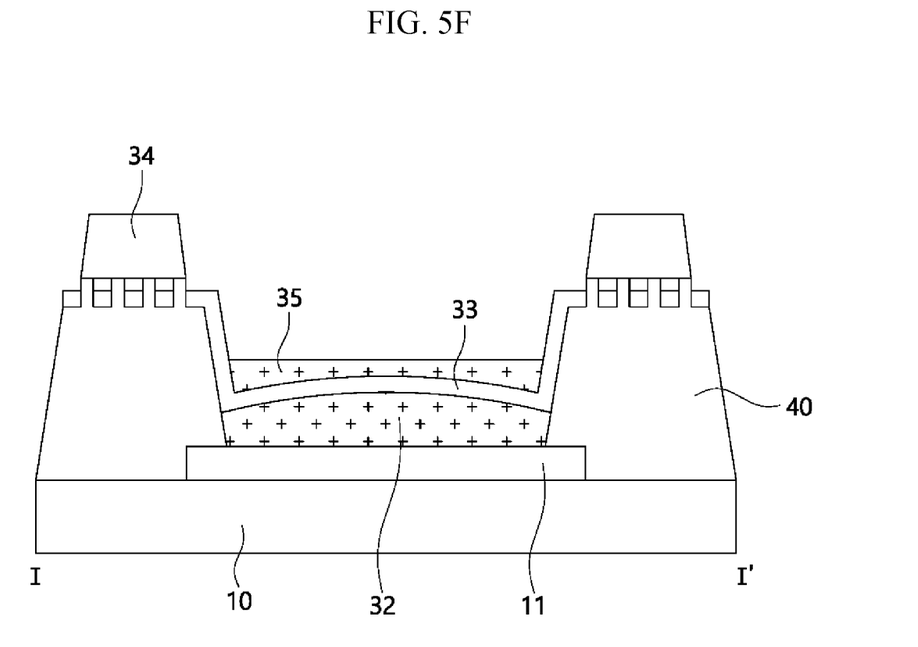

As shown in FIG. 5F, a third organic material layer 35 is then formed on the second organic material layer 33 using an inkjet printing process or a soluble process. The third organic material layer 35 can include the second hole transport layer (HIL) 17 and the second emission material layer (EML) 18 shown in FIG. 4.

In more detail, the second hole transport layer 17 is formed by dropping a second hole transport material solution, and then drying the dropped second hole transport material solution. Subsequently, a second emission material layer 18 is formed by dropping a second emission material solution on the second hole transport layer, and then drying the dropped second emission material solution.

In this instance, an ink having a neutral pH is used as the second hole transport material solution in order to prevent reaction thereof with a metal oxide, which is the charge generation layer 16. Accordingly, it is possible to prevent the charge generation layer 16, which is an under layer, from being dissolved. Since the second bank layer 34, which has hydrophobicity, is present on the upper portion of the first bank layer 40, it is possible to prevent the second hole transport material solution and the second emission material solution dropped onto one subpixel region P from being mixed with those dropped onto another subpixel region P during dropping.

Figure 5G:
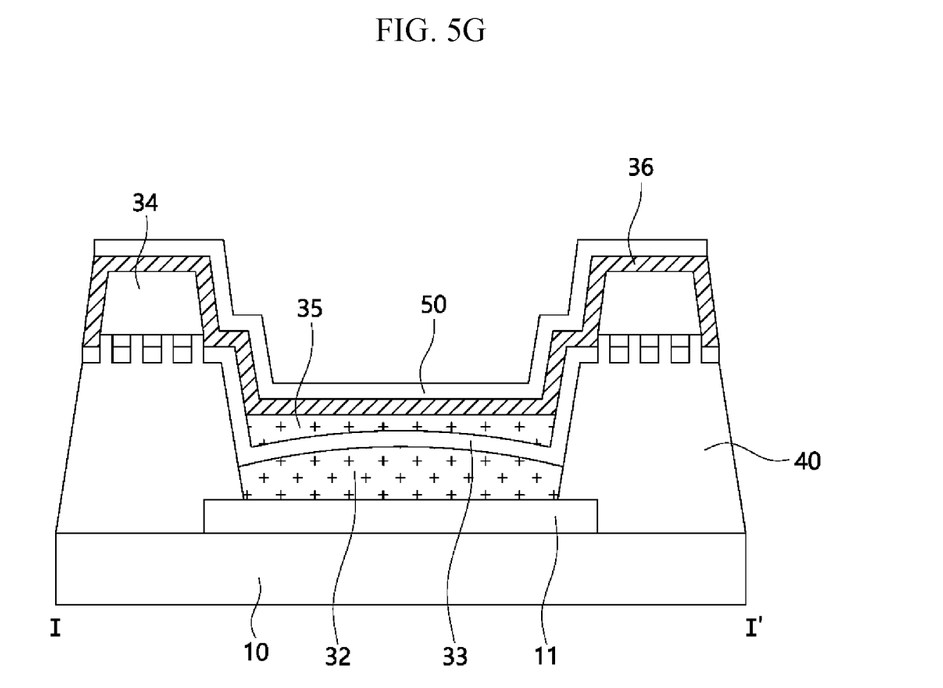

A fourth organic material layer 36 is subsequently formed on the substrate 10 formed with the third organic material layer 35, as shown in FIG. 5G. In this instance, the fourth organic material layer 36 can include the second electron transfer layer (ETL) 19 and the electron injection layer (EIL) 20 shown in FIG. 4. That is, the second electron transfer layer 19 is formed on the substrate 10 formed with the third organic material layer 35, using a deposition process. Thereafter, the electron injection layer 20 is formed on the second electron transfer layer 19, using a deposition process.

Next, a second electrode 50 is formed on the substrate 10 formed with the fourth organic material layer 36, using a deposition process. In addition, when the polyimide type polymer or the carbon compound is patterned using an etching process such as plasma etching or ion milling, micropatterns having various shapes, for example, a triangular shape, a microball array structure, a microlens array structure, and the like can be formed at the upper surface of the first bank layer 40.

Figure 6:
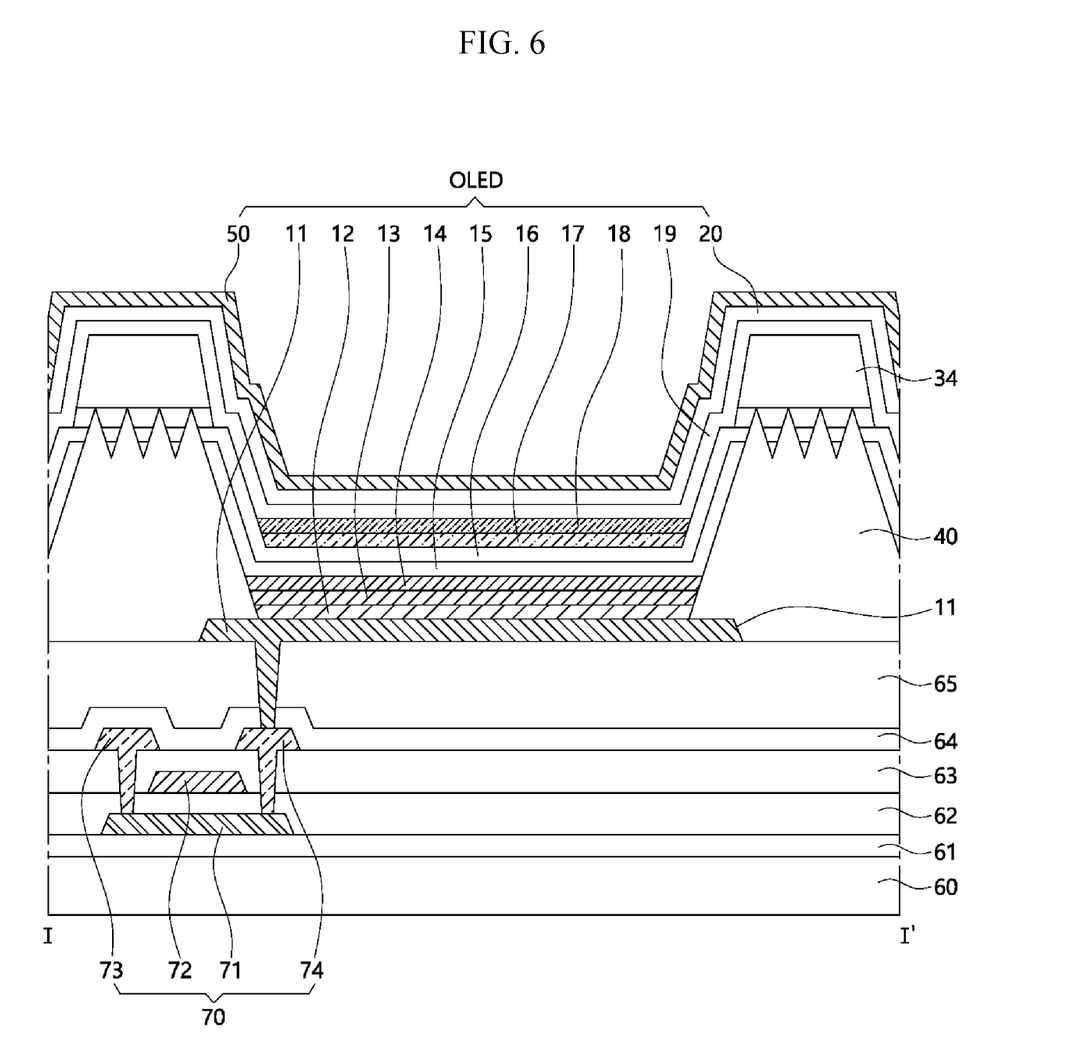
FIG. 6 is a cross-sectional view of one subpixel of an organic light emitting display panel according to a second embodiment of the present.

Next, FIG. 6 is a cross-sectional view of one subpixel of an organic light emitting display panel according to a second embodiment of the present invention taken along line I-I' in FIG. 3. As shown in FIG. 6, the organic light emitting display panel includes a substrate 60, a thin film transistor 70, and an organic light emitting element OLED.

A structure including the substrate 60, the thin film transistor 70 and up to a planarization layer 65 is identical to that of the first embodiment of the present invention described with reference to FIG. 4 and duplicated description is omitted. As shown in FIG. 6, the light emitting element OLED, which includes a first electrode 11, an organic mixture layer and a second electrode 50, and bank layers 40 and 34 are disposed on the planarization layer 65.

Further, the light emitting element OLED emits light in a light emission region defined by the bank layers 40 and 34. That is, light can be emitted from only a portion of the first electrode 11 of the light emitting element OLED not covered by the bank layers 40 and 34. The light emitting element OLED also has a multi-stack structure.

The bank layers 40 and 34 can include a first bank layer 40 and a second bank layer 34. Also, an upper surface of the first bank layer 40 is formed with various micropatterns and thus is hydrophobized. In addition, the second bank layer 34 is formed at the upper surface of the first bank layer 40 using a hydrophobic ink. In the second embodiment of the present invention, the micropatterns formed at the upper surface of the first bank layer 40 have a triangular shape.

A plurality of organic material layers are also disposed between the first electrode 11 and the second electrode 50. For example, the plurality of organic material layers can include a hole injection layer (HIL) 12, a first hole transport layer (HTL) 13, a first emission material layer (EML) 14, a first electron transfer layer (ETL) 15, a charge generation layer (CGL) 16, a second hole transport layer (HIL) 17, a second emission material layer (EML) 18, a second electron transfer layer (ETL) 19, an electron injection layer (EIL) 20, etc.

The hole injection layer (HIL) 12, the first hole transport layer (HTL) 13, the first emission material layer (EML) 14, and the first electron transfer layer (ETL) 15 can be collectively referred to as a "first stack", and the second hole transport layer (HIL) 17, the second emission material layer (EML) 18, the second electron transfer layer (ETL) 19, and the electron injection layer (EIL) 20 can be collectively referred to as a "second stack".

In addition, the hole injection layer (HIL) 12, the first hole transport layer (HTL) 13, and the first emission material layer (EML) 14 are formed using an inkjet printing process and are sequentially formed in this order on the first electrode 11 between adjacent portions of the first bank layer 40. That is, the hole injection layer (HIL) 12, the first hole transport layer (HTL) 13, and the first emission material layer (EML) 14 are not formed at an upper portion of the first bank layer 40 because the upper surface of the first bank layer 40 has hydrophobicity.

Further, the first electron transfer layer (ETL) 15 and the charge generation layer (CGL) 16 are formed using a deposition process and are sequentially formed in this order to extend on and along upper portions of the first bank layer 40 adjacent to each other and the first emission material layer EML 14. The first electron transfer layer (ETL) 15 and the charge generation layer (CGL) 16 are also formed between the triangular micropatterns formed on the upper surface of the first bank layer 40.

In addition, the second hole transport layer (HIL) 17 and the second emission material layer (EML) 18 are formed using an inkjet printing process and are sequentially formed in this order on the charge generation layer (CGL) 16 between the adjacent portions of the first bank layer 40. That is, the second hole transport layer (HIL) 17 and the second emission material layer (EML) 18 are not formed on the second bank layer 34 because the second bank layer 34 has hydrophobicity.

The second electron transfer layer (ETL) 19, the electron injection layer (EIL) 20, and the second electrode 50 are also formed using a deposition process and are sequentially formed in this order to extend on and along the adjacent upper portions of the first bank layer 40, upper portions of the second bank layer 34 adjacent to each other and the second emission material layer (EML) 18. In addition, micropatterns having a microball array structure can be formed at the upper surface of the first bank layer 40.

Figure 7:
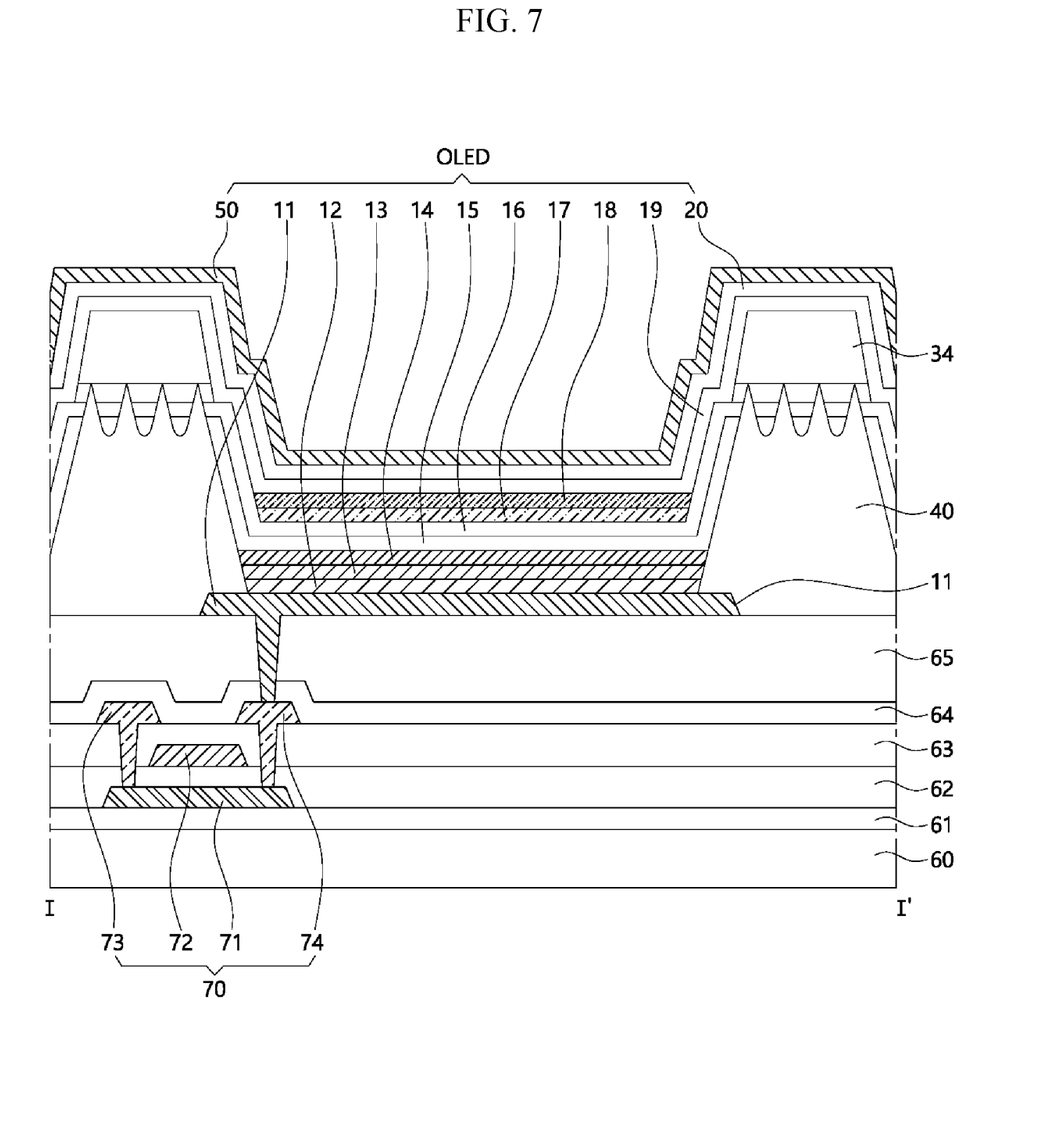
FIG. 7 is a cross-sectional view of one subpixel of an organic light emitting display panel according to a third embodiment of the present invention.

Next, FIG. 7 is a cross-sectional view of one subpixel of an organic light emitting display panel according to a third embodiment of the present invention taken along line I-I' in FIG. 3. As shown in FIG. 7, the organic light emitting display panel according to the third embodiment of the present invention includes a substrate 60, a thin film transistor 70, and an organic light emitting element OLED.

A structure including the substrate 60, the thin film transistor 70 and up to a planarization layer 65 is identical to that of the first embodiment of the present invention described with reference to FIG. 4 and thus a duplicative description is omitted. As shown, the light emitting element OLED, which includes a first electrode 11, an organic mixture layer and a second electrode 50, and a bank layer 40 and 34 are disposed on the planarization layer 65.

In addition, the light emitting element OLED emits light in a light emission region thereof defined by the bank layers 40 and 34. That is, light can be emitted from only a portion of the first electrode 11 of the light emitting element OLED not covered by the bank layers 40 and 34. The light emitting element OLED also has a multi-stack structure.

As shown, an upper surface of the first bank layer 40 is formed with various micropatterns and thus is hydrophobized. The second bank layer 34 is also formed at the upper surface of the first bank layer 40 using a hydrophobic ink. In the third embodiment of the present invention, the micropatterns formed at the upper surface of the first bank layer 40 have a microball array structure.

A plurality of organic material layers are disposed between the first electrode 11 and the second electrode 50. For example, the plurality of organic material layers can include a hole injection layer (HIL) 12, a first hole transport layer (HTL) 13, a first emission material layer (EML) 14, a first electron transfer layer (ETL) 15, a charge generation layer (CGL) 16, a second hole transport layer (HIL) 17, a second emission material layer (EML) 18, a second electron transfer layer (ETL) 19, an electron injection layer (EIL) 20, etc.

The hole injection layer (HIL) 12, the first hole transport layer (HTL) 13, the first emission material layer (EML) 14, and the first electron transfer layer (ETL) 15 can be collectively referred to as a "first stack", and the second hole transport layer (HIL) 17, the second emission material layer (EML) 18, the second electron transfer layer (ETL) 19, and the electron injection layer (EIL) 20 can be collectively referred to as a "second stack".

In addition, the hole injection layer (HIL) 12, the first hole transport layer (HTL) 13, and the first emission material layer (EML) 14 are formed using an inkjet printing process and are sequentially formed in this order on the first electrode 11 between adjacent portions of the first bank layer 40. That is, the hole injection layer (HIL) 12, the first hole transport layer (HTL) 13, and the first emission material layer (EML) 14 are not formed at an upper portion of the first bank layer 40 because the upper surface of the first bank layer 40 has hydrophobicity.

Further, the first electron transfer layer (ETL) 15 and the charge generation layer (CGL) 16 are formed using a deposition process and are sequentially formed in this order to extend on and along upper portions of the first bank layer 40 adjacent to each other and the first emission material layer EML 14. The first electron transfer layer (ETL) 15 and the charge generation layer (CGL) 16 are also formed between the micropatterns formed on the upper surface of the first bank layer 40 while having a microball array structure.

In addition, the second hole transport layer (HIL) 17 and the second emission material layer (EML) 18 are formed using an inkjet printing process and are sequentially formed in this order on the charge generation layer (CGL) 16 between the adjacent portions of the first bank layer 40. That is, the second hole transport layer (HIL) 17 and the second emission material layer (EML) 18 are not formed on the second bank layer 34 because the second bank layer 34 has hydrophobicity.

The second electron transfer layer (ETL) 19, the electron injection layer (EIL) 20, and the second electrode 50 are also formed using a deposition process and are sequentially formed in this order to extend on and along the adjacent upper portions of the first bank layer 40, upper portions of the second bank layer 34 adjacent to each other and the second emission material layer (EML) 18. In addition, micropatterns having a microlens array structure can be formed at the upper surface of the first bank layer 40.

Figure 8:
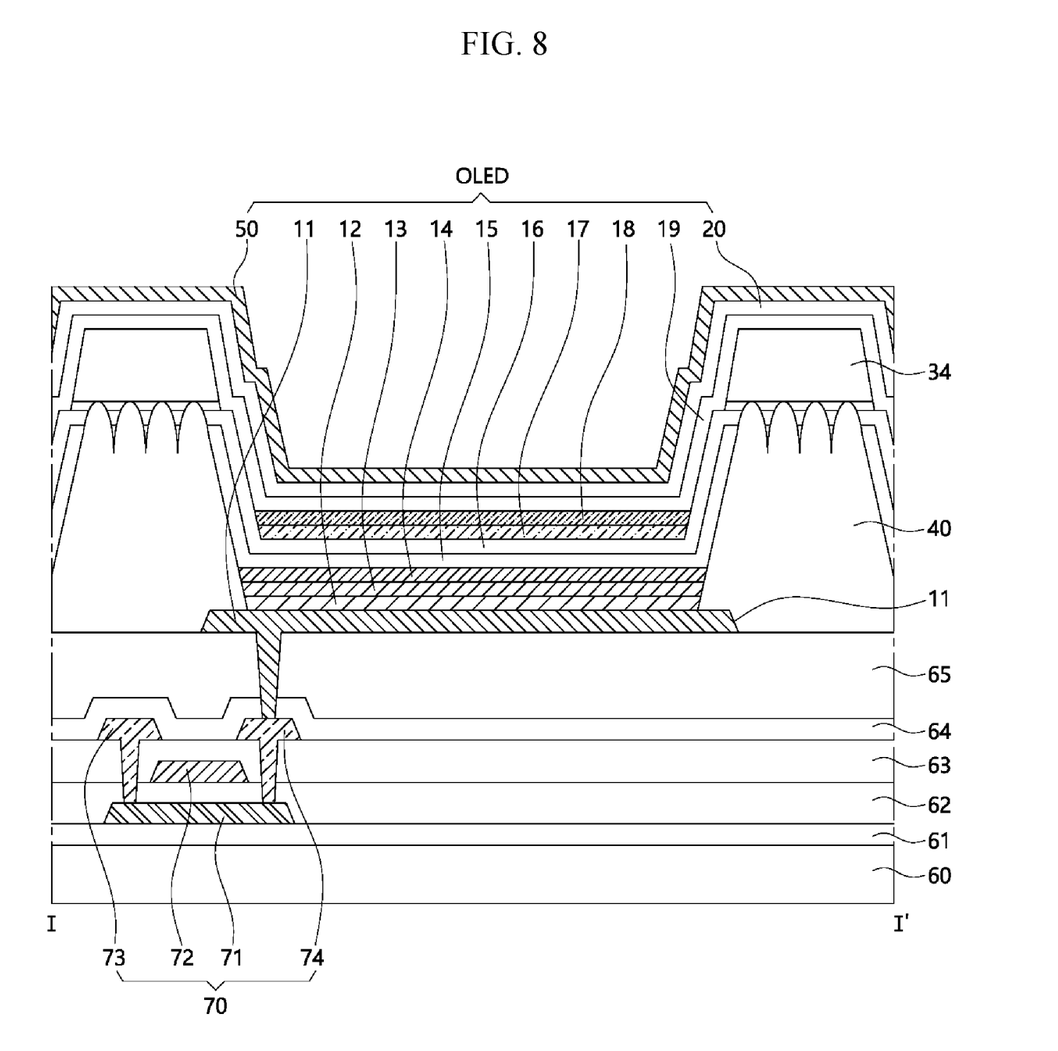
FIG. 8 is a cross-sectional view of one subpixel of an organic light emitting display panel according to a fourth embodiment of the present invention.

Next, FIG. 8 is a cross-sectional view of one subpixel of an organic light emitting display panel according to a fourth embodiment of the present invention taken along line I-I' in FIG. 3. As shown in FIG. 8, the organic light emitting display panel according to the fourth embodiment of the present invention includes a substrate 60, a thin film transistor 70, and an organic light emitting element OLED A structure including the substrate 60, the thin film transistor 70 and up to a planarization layer 65 is identical to that of the first embodiment of the present invention described with reference to FIG. 4 and thus duplicative description is omitted. The light emitting element OLED, which includes a first electrode 11, an organic mixture layer and a second electrode 50, and a bank layer 40 and 34 are disposed on the planarization layer 65.

In addition, the light emitting element OLED emits light in a light emission region thereof defined by the bank layers 40 and 34. That is, light can be emitted from only a portion of the first electrode 11 of the light emitting element OLED not covered by the bank layers 40 and 34. The light emitting element OLED has a multi-stack structure.

The bank layers 40 and 34 include a first bank layer 40 and a second bank layer 34. An upper surface of the first bank layer 40 is also formed with various micropatterns and is hydrophobized. Further, the second bank layer 34 is formed at the upper surface of the first bank layer 40 using a hydrophobic ink. In the fourth embodiment of the present invention, the micropatterns formed at the upper surface of the first bank layer 40 have a microlens array structure.

A plurality of organic material layers are also disposed between the first electrode 11 and the second electrode 50. For example, the plurality of organic material layers can include a hole injection layer (HIL) 12, a first hole transport layer (HTL) 13, a first emission material layer (EML) 14, a first electron transfer layer (ETL) 15, a charge generation layer (CGL) 16, a second hole transport layer (HIL) 17, a second emission material layer (EML) 18, a second electron transfer layer (ETL) 19, an electron injection layer (EIL) 20, etc.

The hole injection layer (HIL) 12, the first hole transport layer (HTL) 13, the first emission material layer (EML) 14, and the first electron transfer layer (ETL) 15 can be collectively referred to as a "first stack", and the second hole transport layer (HIL) 17, the second emission material layer (EML) 18, the second electron transfer layer (ETL) 19, and the electron injection layer (EIL) 20 can be collectively referred to as a "second stack".

In addition, the hole injection layer (HIL) 12, the first hole transport layer (HTL) 13, and the first emission material layer (EML) 14 are formed using an inkjet printing process and are sequentially formed in this order on the first electrode 11 between adjacent portions of the first bank layer 40. That is, the hole injection layer (HIL) 12, the first hole transport layer (HTL) 13, and the first emission material layer (EML) 14 are not formed at an upper portion of the first bank layer 40 because the upper surface of the first bank layer 40 has hydrophobicity.

Further, the first electron transfer layer (ETL) 15 and the charge generation layer (CGL) 16 are formed using a deposition process and are sequentially formed in this order to extend on and along upper portions of the first bank layer 40 adjacent to each other and the first emission material layer EML 14. The first electron transfer layer (ETL) 15 and the charge generation layer (CGL) 16 are formed between the micropatterns formed on the upper surface of the first bank layer 40 while having a microlens array structure.

Also, the second hole transport layer (HIL) 17 and the second emission material layer (EML) 18 are formed using an inkjet printing process and are sequentially formed in this order on the charge generation layer (CGL) 16 between the adjacent portions of the first bank layer 40. That is, the second hole transport layer (HIL) 17 and the second emission material layer (EML) 18 are not formed on the second bank layer 34 because the second bank layer 34 has hydrophobicity.

In addition, the second electron transfer layer (ETL) 19, the electron injection layer (EIL) 20, and the second electrode 50 are formed using a deposition process and are sequentially formed in this order to extend on and along the adjacent upper portions of the first bank layer 40, upper portions of the second bank layer 34 adjacent to each other and the second emission material layer (EML) 18.

As apparent from the above description, in accordance with the organic light emitting display panel and the method for manufacturing the same according to the exemplary embodiments of the present invention, a light emitting element having a multi-stack structure can be formed through combination of an inkjet printing process and a deposition process. Accordingly, it is possible to not only enhance luminous brightness, but also to enhance display quality of the organic light emitting display panel. In addition, because the light emitting element is configured through combination of an inkjet printing process and a deposition process, it is possible to select various materials for each organic emission material layer.

The foregoing descriptions and the accompanying drawings have been presented in order to illustratively explain technical ideas of the present invention. A person skilled in the art to which the present invention pertains can appreciate that diverse modifications and variations obtained by combining, dividing, substituting for, or changing constituent elements can be possible without changing essential characteristics of the present invention. Therefore, the foregoing embodiments disclosed herein shall be interpreted as illustrative only and not as limitative of the principle and scope of the present invention. It should be understood that the scope of the present invention shall be defined by the appended claims and all of their equivalents fall within the scope of the present invention.

What is claimed is:

1. An organic light emitting display panel comprising:
a substrate including a plurality of subpixel regions;
a first electrode disposed on the substrate in each subpixel region;
a first bank layer disposed in a boundary portion of each subpixel region and covering an edge of the first electrode, the first bank layer including micropatterns at an upper surface thereof, a first printed organic material layer disposed on the first electrode and a side surface of the first bank layer;
a second deposited organic material layer disposed on the first organic material layer and the first bank layer;
a second bank layer disposed at the upper surface of the first bank layer;
a third printed organic material layer disposed on the side surface of the first bank layer and the second organic material layer;
a fourth deposited organic material layer disposed on the third organic material layer and the second bank layer; and
a second electrode disposed on the fourth organic material layer.

2. The organic light emitting display panel according to claim 1, wherein the first printed organic material layer comprises a hole injection layer, a first hole transport layer, and a first emission material layer.

3. The organic light emitting display panel according to claim 1, wherein the second deposited organic material layer is disposed between the micropatterns at the upper surface of the first bank layer.

4. The organic light emitting display panel according to claim 1, wherein the second deposited organic material layer comprises a first electron transfer layer and a charge generation layer.

5. The organic light emitting display panel according to claim 4, wherein the charge generation layer includes a first metal oxide layer of an amorphous compound of zinc oxide and silicon oxide and a second metal oxide layer of molybdenum oxide ($MoO_3$) ohmic-contact each other.

6. The organic light emitting display panel according to claim 1, wherein the second bank layer includes a hydrophobic material comprising Teflon.

7. The organic light emitting display panel according to claim 1, wherein the second bank layer has a smaller horizontal width than the first bank layer and has a height equal to a depth of the micropatterns formed at the upper surface of the first bank layer or not greater than 0.5 micrometers.

8. The organic light emitting display panel according to claim 2, wherein the third printed organic material layer comprises a second hole transport layer and a second emission material layer.

9. The organic light emitting display panel according to claim 4, wherein the fourth deposited organic material layer comprises a second electron transfer layer and an electron injection layer.

10. The organic light emitting display panel according to claim 1, wherein the micropatterns at an upper surface of the first bank layer comprises a pillar shaped micropattern, a triangular shaped micropattern, a microball array structure, or a microlens structure.

11. A method for manufacturing an organic light emitting display panel, the method comprising:
forming a first electrode on a substrate including a plurality of subpixel regions in each subpixel region;
forming a first bank layer formed with micropatterns at an upper surface thereof in a boundary portion of each subpixel region so the first bank layer covers an edge of the first electrode;
forming a first organic material layer on the first electrode through a first inkjet printing process;
forming a second organic material layer on the substrate formed with the first organic material layer through a first deposition process;
forming a second bank layer at the upper surface of the first bank layer;
forming a third organic material layer on the second organic material layer on the substrate formed with the second bank layer through a second inkjet printing process;
forming a fourth organic material layer on the third organic material layer and the second bank layer through a second deposition process; and
forming a second electrode disposed on the fourth organic material layer.

12. The method according to claim 11, wherein:
the first organic material layer comprises a hole injection layer, a first hole transport layer, and a first emission material layer; and
the hole injection layer, the first hole transport layer, and the first emission material layer are sequentially formed in this order through the first inkjet printing process.

13. The method according to claim 11, wherein the second organic material layer is formed between the micropatterns formed at the upper surface of the first bank layer.

14. The method according to claim 11, wherein:
the second organic material layer comprises a first electron transfer layer and a charge generation layer; and
the first electron transfer layer and the charge generation layer are sequentially formed in this order through the first deposition process.

15. The method according to claim 14, wherein the charge generation layer is formed so a first metal oxide layer of an amorphous compound of zinc oxide and silicon oxide and a second metal oxide layer of molybdenum oxide ($MoO_3$) ohmic-contact each other.

16. The method according to claim 11, wherein the second bank layer is formed of a hydrophobic material comprising Teflon.

17. The method according to claim 11, wherein the second bank layer is formed to have a smaller horizontal width than the first bank layer and to have a height equal to a depth of the micropatterns formed at the upper surface of the first bank layer or not greater than 0.5 micrometers.

18. The method according to claim 11, wherein:
the third organic material layer comprises a second hole transport layer and a second emission material layer; and
the second hole transport layer and the second emission material layer are sequentially formed in this order through the second inkjet printing process.

19. The method according to claim 14, wherein:
the fourth organic material layer comprises a second electron transfer layer and an electron injection layer; and
the second electron transfer layer and the electron injection layer are sequentially formed in this order through the second deposition process.

20. The method according to claim 11, wherein the micropatterns at an upper surface of the first bank layer comprises a pillar shaped micropattern, a triangular shaped micropattern, a microball array structure, or a microlens structure.

* * * * *